United States Patent
Matsumoto et al.

(10) Patent No.: US 8,254,144 B2
(45) Date of Patent: Aug. 28, 2012

(54) CIRCUIT BOARD LAMINATED MODULE AND ELECTRONIC EQUIPMENT

(75) Inventors: Katsuji Matsumoto, Kanagawa (JP); Shusaku Yanagawa, Kanagawa (JP); Shuichi Oka, Kanagawa (JP); Shinji Rokuhara, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/926,901

(22) Filed: Dec. 16, 2010

(65) Prior Publication Data

US 2011/0157857 A1 Jun. 30, 2011

(30) Foreign Application Priority Data

Dec. 25, 2009 (JP) ............................. P2009-296130
Nov. 25, 2010 (JP) ............................. P2010-262181

(51) Int. Cl.
*H05K 3/00* (2006.01)

(52) U.S. Cl. ........ 361/803; 361/818; 361/600; 361/780; 257/659; 257/686; 257/773; 257/685; 257/668

(58) Field of Classification Search .................. 361/803, 361/818, 600, 780; 257/659, 686, 773, 777, 257/685, 668
See application file for complete search history.

(56) References Cited

U.S. PATENT DOCUMENTS 7,764,149 B2 *  7/2010  Han et al. ...................... 333/204
2009/0244877 A1 * 10/2009  Yeh et al. ...................... 361/818

FOREIGN PATENT DOCUMENTS

JP  10-199734  7/1998

* cited by examiner

*Primary Examiner* — Tuan T Dinh
*Assistant Examiner* — Hung Dang
(74) *Attorney, Agent, or Firm* — Rader Fishman & Grauer, PLLC

(57) ABSTRACT

A circuit board laminated module includes: a first circuit board having a multi-layer structure in which ground layers are provided in a plurality of layers; a second circuit board mounted on the first circuit board; and a semiconductor chip mounted on the second circuit board, wherein in the first circuit board, a noise guiding through via which guides an electromagnetic noise generated in the semiconductor chip to a lower layer side is provided on a side different from a circuit portion or a circuit element desired to be protected against influence of the electromagnetic noise in a surrounding direction of an occurrence place of the electromagnetic noise.

8 Claims, 5 Drawing Sheets

L1 SURFACE

L2 SURFACE

L3 SURFACE

L4 SURFACE

<AFTER COUNTERMEASURE>

L1 SURFACE

L2 SURFACE

L3 SURFACE

L4 SURFACE

CIRCUIT BOARD LAMINATED MODULE AND ELECTRONIC EQUIPMENT

BACKGROUND OF THE INVENTION

1. Field of the Invention

The present invention relates to a circuit board laminated module in which a second circuit board is mounted on a first circuit board, and a semiconductor chip is bare-chip mounted on the upper surface of the second circuit board. Besides, the present invention relates to an electronic equipment in which a first circuit board as a mother board has a structure of the circuit board laminated module.

2. Description of the Related Art

An electronic product is miniaturized, is reduced in thickness, is improved in functionality and is improved for higher frequency. A circuit section of the electronic product is generally constructed by mounting semiconductor integrated circuits (hereinafter referred to as IC chips) and other many circuit parts on a printed wiring board.

In the IC chip constituting the electronic product, an improvement in fineness and improvement in integration advance, and a system LSI is developed which realizes the whole function block, which is conventionally constructed of a printed wiring board, plural ICs and other circuit parts, by one semiconductor chip.

On the other hand, a printed wiring board and a mounted part are required to support higher frequency and higher speed, and to achieve an improvement in fineness and higher integration.

For the miniaturization and reduction in thickness of an electronic equipment, it is requested that in addition to an IC chip, plural circuit elements (devices), such as passive elements of inductors, capacitors and resistors, are mounted in a small space on the same board. In order to meet the request, a system in package (SiP) in which plural IC chips and passive parts are mounted on one package is put into practical use.

Besides, for further miniaturization and reduction in height (reduction in thickness), the technology of forming passive elements in the inside of a printed wiring board is actively developed. By this technology, the cost of an external part which is difficult to incorporate in an IC under present circumstances is reduced, and further, it becomes possible to prevent the external part from impeding the miniaturization and reduction in height of the whole board.

When the miniaturization and reduction in height advance, there is a fear that a phenomenon occurs in which at the time of circuit operation mainly including an active element, the characteristic of a surrounding passive element is changed by radiated electromagnetic wave or electromagnetic field emitted from the circuit, this is fed back to the circuit and the circuit characteristic is deteriorated.

In order to prevent the electromagnetic interference as stated above, it is necessary to prevent the influence by suitably forming a shield structure.

However, for example, in a passive element, such as an inductor, which itself generates an electromagnetic field, when a conductive layer kept at ground potential exists in the vicinity thereof, an eddy current loss is generated by magnetic flux entering the layer of the ground potential. Then, since the density of the magnetic flux returning to the inductor is reduced, and the Q value and the inductance (L value) are reduced.

As a countermeasure to avoid such disadvantage, a shield layer is separated from an inductance (see, for example, JP-A-10-199734 (patent document 1)).

SUMMARY OF THE INVENTION

However, as in the patent document 1, the countermeasure to separate the shield layer or ground layer from a circuit element such as the inductance requires a large shield box and impedes the miniaturization and reduction in cost of a circuit board laminated module.

Besides, in the circuit board laminated module, ground layers are arranged in many layers thereof, and those are electrically connected to each other. Accordingly, there is a case where radiation noise (electromagnetic wave, etc.) from a circuit including an active element fluctuates the potential of the ground layer, and this is propagated and degrades the circuit characteristic.

The ground layers are provided in many layers since passive elements are mounted in the circuit board by using the multi-layer wiring structure, and the interference between the passive elements must be prevented. Thus, the ground layers can not be removed without reason.

Thus, it is desirable to provide a circuit board laminated module having a structure in which the influence of electromagnetic noise generated from a circuit is quickly reduced without changing the shape of a ground layer in the circuit board laminated module significantly. Besides, it is desirable to provide an electronic equipment in which a first circuit board as a mother board includes the circuit board laminated module.

According to an embodiment of the present invention, there is provided a circuit board laminated module including a first circuit board, a second circuit board and a semiconductor chip.

The first circuit board has a multi-layer structure in which ground layers are provided in plural layers.

The second circuit board is mounted on the first circuit board.

The semiconductor chip is mounted on the second circuit board.

On the plural ground layers of the first circuit board, a noise guiding through via to guide an electromagnetic noise generated in the semiconductor chip to a lower layer side is formed. The noise guiding through via is unevenly provided on a side different from a circuit portion or a circuit element desired to be protected against influence of the electromagnetic noise in a surrounding direction of an occurrence place of the electromagnetic noise.

Here, consideration is given to a case where the noise guiding through via does not exist unlike the above structure.

The electromagnetic noise generated in the semiconductor chip passes through an insulating layer of the laminate board, first enters the closest ground layer in the first circuit board, and fluctuates the potential. When the ground layer is plane-shaped and has a large area, the electromagnetic noise is diffused two-dimensionally. However, when the noise intensity is high and the noise can not be absorbed by the single ground layer, the potential of the ground layer is remarkably varied. Since the variation directly becomes the common noise of the semiconductor chip, a large influence is exerted on the circuit characteristic. Besides, the influence is exerted also on passive elements formed in the inside of or on the upper surface of the first and second circuit boards.

Incidentally, although the ground layer is connected also to another ground layer, a connection place is limited, and quick noise propagation can not be always performed.

In this embodiment, the noise guiding through via to propagate the electromagnetic noise to the lower layer side is arranged at an effective place. Here, the effective place is, for example, a side different from a circuit element which is desired to be protected against the influence of the electromagnetic noise, and is more desirably a specified range including the side opposite to the circuit element. When plural noise guiding through vias exist, the distance between the vias is ensured to a certain extent, and the number of the holes is selected to be effective for quickly guiding the electromagnetic noise. This is preferable when the range receiving the electromagnetic noise is large to a certain extent.

The noise guiding through via itself may be small, and the position and the number thereof are important. Since the intensity of the electromagnetic noise is high, the noise effectively leaks through the small via to the lower layer. The via (noise guiding through via) may be formed to have an easily manufactured size. The through via can be formed during the formation of the general printed wiring board because conductivity is given to the through via by boring with a drill and growth of plating. Accordingly, the size of the through via is preferably the same as that of the ordinary through via, but any problem may be caused even if the through via is larger or smaller than the ordinary one. Details of the production of the through via will be given with reference to a sectional structure described below.

From the above, the noise guiding through via of the embodiment of the invention quickly propagates and diffuses the radiation noise having high energy intensity to the lower region side with little influence, while the removal performance of the propagation noise propagating in the conductive layer is maintained.

According to another embodiment of the present invention, there is provided an electronic equipment including a first circuit board as a mother board in the inside of an equipment housing. The first circuit board includes a second circuit board, a semiconductor chip and a noise guiding through via similarly to the foregoing circuit board laminated module.

According to the embodiments of the present invention, the circuit board laminated module having the structure to quickly reduce the influence of the electromagnetic noise can be provided. Besides, according to the embodiments of the present invention, the electronic equipment can be provided in which the first circuit board as the mother board is the circuit board laminated module.

DESCRIPTION OF PREFERRED EMBODIMENTS

Embodiments of the present invention will be described with reference to the drawings in the following sequence, while a high frequency circuit module is used as an example.

1. Sectional structure of module
2. Ground layer opening below inductor
3. Example of high frequency circuit
4. Suitable arrangement of noise guiding through vias and effect thereof
5. Example of product application <1. Sectional Structure of Module>

Figure 1:
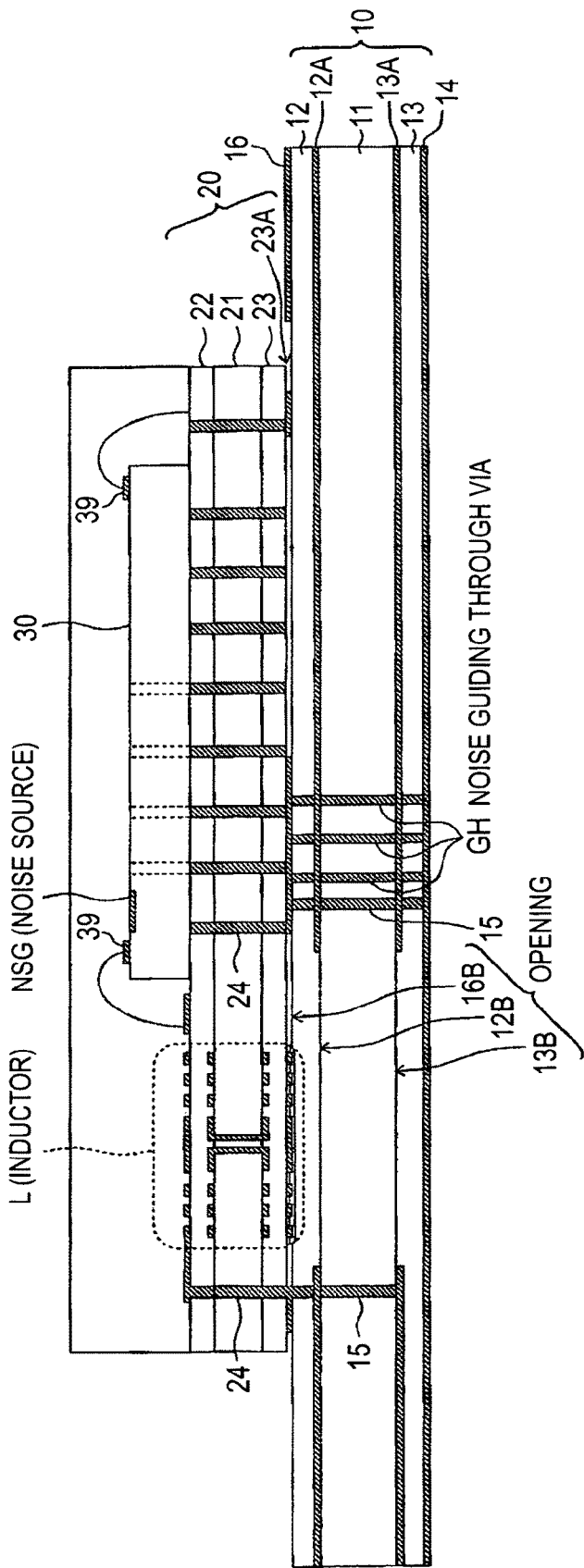
FIG. 1 is a schematic sectional view of a circuit board laminated module of an embodiment.

FIG. 1 is a schematic sectional view of a circuit board laminated module of an embodiment.

A circuit board laminated module 1 shown in FIG. 1 roughly includes a first circuit board 10, and a second circuit board 20 mounted on an upper surface of the first circuit board 10.

The first circuit board 10 includes a core substrate 11, a wiring layer 12A is formed on a front surface of the core substrate 11, and a wiring layer 13A formed on a rear surface of the core substrate 11.

The wiring layer 12A is patterned separately from a ground layer because the wiring layer 12A may be used ds a power supply layer depending on the circuit configuration.

An insulating substrate 12 as a substrate resin layer is bonded to a front surface side of the core substrate 11 on which the wiring layer 12A is formed. Similarly, an insulating substrate 13 as another substrate resin layer is bonded to a rear surface side of the core substrate 11 on which the wiring layer 13A is formed.

A conductive film, such as a copper foil, which becomes a wiring layer is previously formed on a surface of each of the insulating substrates 12 and 13 opposite to the core substrate, and a wiring layer is formed by patterning the conductive film.

In FIG. 1, the illustration of the wiring layer on the front surface side of the insulating substrate 12 is omitted. On the other hand, the wiring layer on the rear surface side of the insulating substrate 13 is formed as a rear surface ground plane 14 which is a conductive layer occupying a relatively large area on the rear surface of the insulating substrate 13. Incidentally, the ground plane is the lowermost layer in ground layers according to the invention. Since especially the ground layer of the lowermost layer is formed to have the relatively wide area, this name is used.

The first circuit board 10 shown in FIG. 1 has a build-up multi-layer wiring structure in which four wiring layers (all layers are the ground layers in the illustrated example) are laminated upward in order from the rear surface ground plane 14 of the lowermost layer to the not-shown uppermost wiring layer. The wiring layers are not limited to the four layers, and the number of the layers may be any number more than two. When the number of laminate layers is made four or more, an insulating substrate having a conductive layer, such as a copper foil, on an upper surface is bonded to the insulating substrate 12, and lamination on the rear surface side is also performed by bonding an insulating substrate having a copper foil. In any way, the layer called the rear surface ground plane is finally positioned on the rear surface of the first circuit board 10 and is formed as a conductive layer having a relatively large area.

Patterning of the wiring layers of the respective layers is performed using a plating method or another conductive layer forming technique. The plating method may use either electroless plating or electrolytic plating. As another conductive layer forming technique, etching using a resist pattern formed by double-sided mask aligning can be adopted.

In the formation of a substrate through via in the core substrate 11, a via hole is formed beforehand by drilling or laser processing after the wiring layers 12A, 13A, 14 and 16 are formed. When the wiring layers 12A, 13A, 14 and 16 are formed by electrolytic plating, a thin conductive film, which is required in the formation method, covers the inner wall of the via hole, and plating growth is performed also on the inside of the via hole, so that the substrate through via is formed. When the conductive layer can not be embedded by plating, a process of embedding the insulating resin is additionally required.

Some of substrate through vias are used for extracting the electrodes of passive elements in the inside of the substrate and for connection between the elements, and some other vias are used also for ground wiring connection. An example of the substrate through via for the ground wiring connection is denoted by reference numeral 15 in FIG. 1. The rear surface ground plane 14, the ground wiring layers in the inside of the first circuit board 10, and the ground wiring layer of the uppermost layer (front surface) have electrically almost the same potential (ground potential) through the first substrate through via 15.

A noise guiding through via GH described later is formed at a time in the same manner as the substrate through via.

The second circuit board 20 as the other laminate circuit board is mounted on the upper surface of the first circuit board having the structure as stated above. Circuit parts including an IC are mounted on, for example, the principal surface (front surface) of the second circuit board 20 on the opposite side to the first circuit board. FIG. 1 shows a bare semiconductor chip and an inductor L as the circuit parts.

In the circuit board laminated module structure as described above, a so-called printed wiring board of an later-mentioned electronic equipment corresponds to the first circuit board 10, and this is generally called a mother board. The second circuit board 20 inserted between the electronic part group constituting the electronic circuit and the mother board is generally called an interposer, and is differentiated from the mother board.

The second circuit board 20 as the interposer has the same basic structure as that of the first circuit board 10 (build-up circuit board).

That is, the second circuit board 20 includes a core substrate 21, a not-shown wiring layer is formed on a front surface of the core substrate 21, and a not-shown wiring layer is formed also on a rear surface of the core substrate 211.

An insulating substrate 22 as a substrate resin layer is bonded to the front surface side of the core substrate 21 on which the wiring layer is formed. Similarly, an insulating substrate 23 as another substrate resin layer is bonded to the rear surface side of the core substrate 21 on which the other wiring layer is formed.

A conductive film, such as a copper foil, which becomes a wiring line is previously formed on a surface of each of the insulating substrates 22 and 23 on the opposite side to the core substrate, and the conductive film is patterned so that the wiring layer is formed.

In FIG. 1, the illustration of the wiring layer (hereinafter referred to as the upper wiring layer) of the substrate resin layer 22 on the front side is almost omitted except for the inductor portion.

The inductor L is formed from the inside of the board to the front surface by mutually connecting plural coil wire patterns formed of plural hierarchical wiring layers of the second circuit board 20 by through holes.

The inductor L of the illustrated example is formed in the second circuit board 20 by laminating four layers of coil wires obtained by processing the wiring layer into a spiral shape. The number of the layers and the processed shape of the coil wiring are not limited. Accordingly, the shape of the coil wiring is not limited to a curved line, and may be a square, a straight line or a combination of those.

Incidentally, although not shown, a lead wiring of the inductor L shown in FIG. 1 is electrically connected to a specified circuit block of a semiconductor chip 30 by wire bonding at a place not shown in FIG. 1 or through the inner wiring of the second circuit board 20 and through the chip rear side connection.

A feature of this embodiment is that among the wiring layers of the four ground layers in the first circuit board 10, small through holes called noise guiding through vias GH are provided in some layers from the upper layer among three layers including the rear surface ground plane 14 (i.e., the wiring layers 10, 13A and 14).

The number of the noise guiding through vias GH is not limited. However, with respect to the position, an occurrence place (noise source NSG) of electromagnetic noise of the semiconductor chip is made a reference, and the noise guiding through vias GH are arranged on a side different from the circuit element (here, the inductor L) desired to be protected against influence of the electromagnetic noise, more preferably, in a specified range including the opposite side. The operation and effect of the noise guiding through via GH, the detailed form of arrangement, and an arrangement example will be described later.

Here, the wiring layer 16 of the uppermost layer is called an L1 surface, the wiring layer 12A of the lower layer is called an L2 surface, the wiring layer 13A of the next lower layer is called an L3 surface, and the rear surface ground plane 14 of the lowermost layer is called an L4 surface.

<2. Ground Layer Opening Below Inductor>

Besides, another feature of this embodiment is that part of the L1 surface (the wiring layer 16), the L2 surface (the wiring layer 12A) and the L3 surface (the wiring layer 13A) in the lower region of the inductor L are removed and openings 16B, 12B and 13B are formed. The sizes of the openings are larger than the occupied area of the inductor L. Thus, the ground layer of the inductor L is actually the rear surface ground plane 14.

This structure has the operation and effect to prevent that the magnetic flux emitted from the inductor L generates an eddy current in the conductive layer, and the Q value and L value of the inductor L are reduced by the loss (absorption of the magnetic flux) due to the eddy current.

Figure 2:
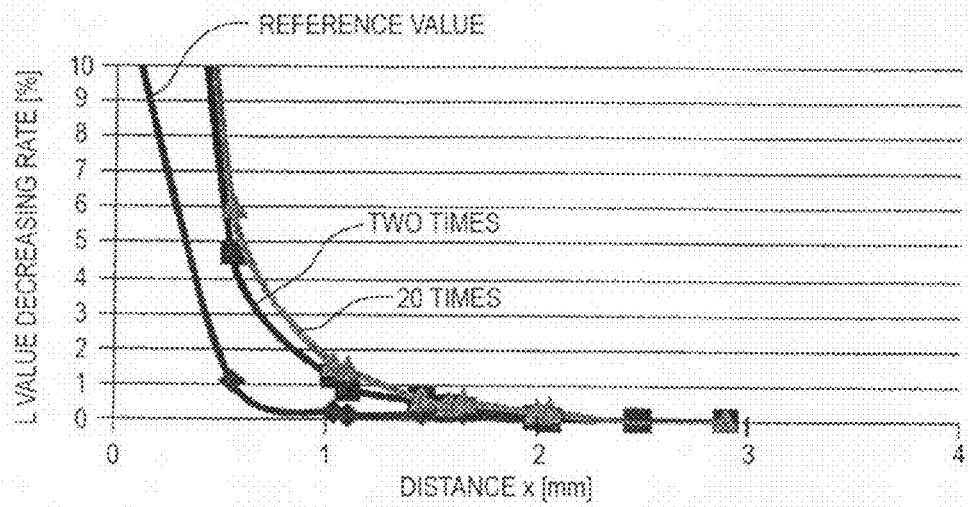
FIG. 2 is a graph showing L value change rate data dependent on distance between an inductor and a ground layer.

FIG. 2 shows L value change rate data dependent on a distance between the inductor and the ground layer.

The horizontal axis of the graph of FIG. 2 indicates the distance x (unit: mm) in the board thickness direction between the inductor L and the ground layer, and the vertical axis indicates the L value decreasing rate (unit: %).

Here, three kinds of L values (initial values) which are a reference value, a value twice the reference value and a value 20 times larger than the reference value are prepared, and the distance dependency of the L value change is examined.

From this graph, as the ground layer approaches the inductor L, the decreasing rate of the L value increases. When the L value is high, the decreasing rate becomes remarkable when the distance becomes 1 mm or less, and the variation becomes large. Although depending on the L value, when the distance is 1 mm or more, the stable data is obtained.

<3. Example of High Frequency Circuit>

The function of a circuit realized by the semiconductor chip 30 is not limited in the application of the invention.

However, in this embodiment, for more specific and practical description, a description will be made while using, as a specific example, the semiconductor chip 30 in which part of a front-end section of a tuner circuit used in a television receiver or the like is formed into one chip.

In general, in order to integrate an oscillator, a filter, a matching circuit, a modulation circuit and the like in one package, it is necessary to use plural inductors and plural capacitors.

For example, in a TV tuner, it is necessary that a broadcast signal received by an antenna is tuned to an objective frequency by a tuning circuit including a capacitor and an inductor. Besides, it is necessary that the received signal is tuned by an inter-stage tuning circuit including a capacitor and an inductor through a high frequency amplifier. With respect to the tuner as descried above, although the capacitor of the tuning circuit can be incorporated in the IC in the foregoing circuit board laminated module 1, the inductor is externally attached to the IC under present circumstances.

Incidentally, in usage other than the television receiver, an inductor is used in, for example, a modulation circuit which modulates a base band signal of a portable wireless terminal and obtains a wireless signal, a demodulation circuit which performs a process reverse to that, or a high frequency circuit including a local oscillation circuit to generate a carrier wave used for modulation and demodulation.

Figure 3:
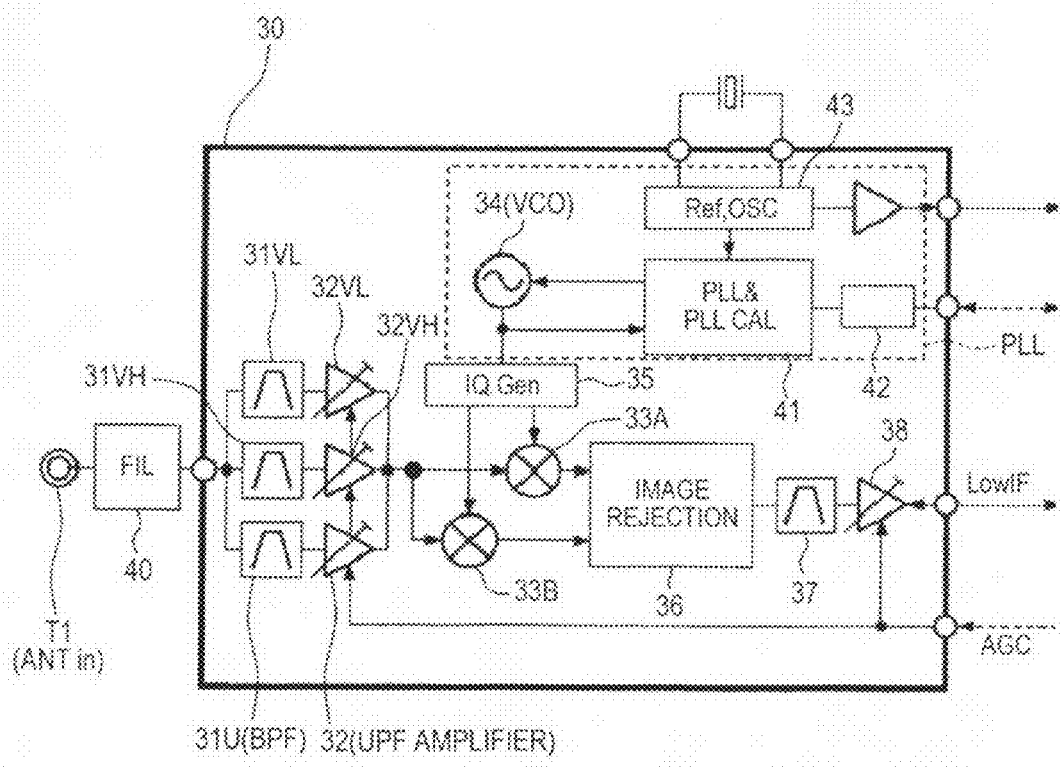
FIG. 3 is a block structural view of a front-end circuit of a TV tuner, which is formed into one chip of a semiconductor chip of FIG. 1.

FIG. 3 is a block structural view of a front-end circuit of a TV tuner formed into one chip in the semiconductor chip 30 (hereinafter simply referred to as an IC) of FIG. 1.

The tuner front-end IC (semiconductor chip 30) shown in FIG. 3 supports three bands of reception frequencies of 46 to 147 MHz (VL band), 147 to 401 MHz (VH band), and 401 to 887 MHz (U band). These correspond to frequency bands used in television broadcasts of different countries. The semiconductor chip 30 includes three sets of band pass filters (BPF) and RF amplifiers as a structure to receive input signals in three bands. Specifically, a filter 31VL and an RF amplifier 32VL corresponding to the VL band, a filter 31VH and an RF amplifier 32VH corresponding to the VH band, and a filter 31U and an RF amplifier 32U corresponding to the U band are provided in parallel at an input terminal.

Each of the band pass filters (filters 31) includes a capacitor and an inductor for each band in order to select a desired frequency in each reception band. Although not shown in FIG. 3, the inductor is provided as an external circuit element.

The structure of the reception section corresponds to a contrivance to perform band division by a simplified circuit instead of a reception system in which a tuning circuit using a varicap diode, an RF amplifier and an inter-stage tuning circuit are provided for each band. The tuning circuit also requires an inductor of a relatively large L value, and the invention can be applied. Thus, the structure can be changed to one adapted to a tuning circuit system. In that case, a contrivance such as a memory to give variable capacity as digital data is required.

Incidentally, a balun 40 (phase adjuster for impedance adjustment) as an individual part different from the IC is connected between the input terminal and an antenna terminal T1. Besides, a not-shown antenna switch is provided at the initial stage of the IC. For a received signal inputted from the antenna through the balun 40 to the IC, processing paths (processing paths including the filters (BPF) and the RF amplifiers) for the three bands can be selected by the not-shown antenna switch.

Two mixers 33A and 33B to mix an oscillation signal and a received signal and to perform frequency conversion (down conversion) are connected to the latter stage in the IC of the reception section. Besides, an oscillator (VCO 34) and an IQ generation section 35 to frequency-divide the VCO output and to convert it into two oscillation signals different in phase by 90° are provided.

An image rejection section 36, a filter 37 for noise removal, and an IF amplifier 38 are connected in series to the latter stage of the two mixers 33A and 33B. In the IF amplifier 38 and the RF amplifier 32 for each band, gain control can be performed by an external input.

On the other hand, as a circuit for PLL control, which, together with the VCO 34, constitutes a part of PLL, a PLL control circuit 41, an oscillation circuit 43 and the like are provided.

The VCO 34 oscillates at a frequency corresponding to a control voltage from the PLL control circuit 41.

The PLL control circuit 41 frequency-divides the VCO output by a built-in frequency divider, and a built-in phase comparator compares the VCO output with a reference signal given from the outside. The comparison result is supplied to a loop filter in the PLL control circuit 41, and a DC voltage whose level is changed according to a phase difference between the output of the frequency divider and the reference signal is extracted. The DC voltage is given as a control voltage of an oscillation frequency to the VCO 34. The oscillation circuit 43 controls a control clock of the loop filter based on an external crystal oscillator.

In the TV tuner, as typified by spurious performance, suppression of a noise characteristic and the like is required.

The noise characteristics (resistance properties) relate to high frequency distortion, and the high frequency distortion is mainly caused by nonlinearity of the mixer. Thus, the received signal down-converted by the image rejection section 36 is subjected to noise suppression. However, a noise source, such as the PLL, to generate a high frequency noise exists in the vicinity of the mixer in order to process digital signals. Although a countermeasure against a noise source is usually taken in the inside of the IC, it is important to prevent noise propagation in a common noise mode, which influences an external circuit element mainly through a ground path.

However, in a circuit board laminated module in which high density mounting is required for miniaturization, it is difficult to ensure a distance between a noise source and a circuit element. Besides, even if the distance is ensured, the noise propagation through the ground layer cannot be often prevented.

Especially, when noise is propagated through the ground layer to the inductor L, the spurious performance of the TV tuner is reduced.

From the above reason, the noise propagation through the ground layer is a factor to impede miniaturization and higher density. Thus, it is necessary to improve a ground potential supply layer including the ground layer.

<4. Suitable Arrangement of Noise Guiding Through Vias and Effect Thereof>

In this embodiment, noise propagation to a target of noise propagation blocking, for example, the inductor L is effectively prevented by suitable arrangement of the noise guiding through vias GH.

Hereinafter, a description will be made on the suitable arrangement position of the noise guiding through vias GH obtained through a trial and error process using electromagnetic field simulation, and the difference in the effect of the existence thereof.

FIGS. 4A to 4D show electric field intensity distributions obtained by the electromagnetic field simulation, which are overlapped with ground layer patterns of the L1 surface to the L4 surface.

Figure 4A:
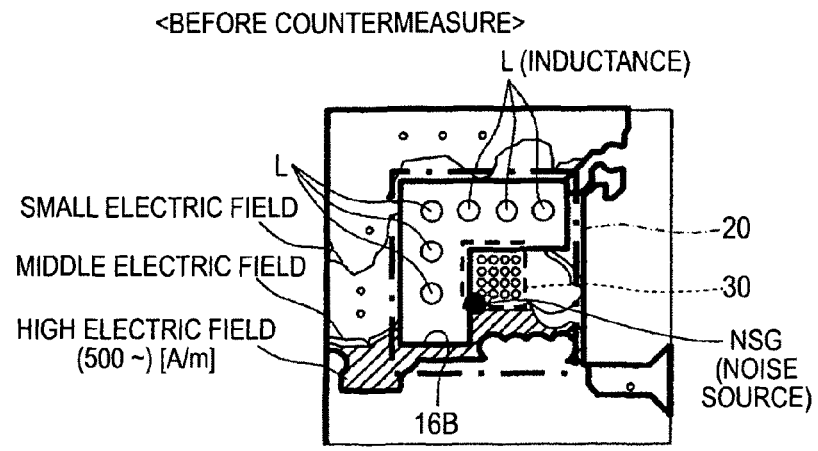
FIGS. 4A to 4D are views showing electric field distributions obtained by electromagnetic field simulation, which are overlapped with ground layer patterns of an L1 surface to an L4 surface and are obtained before a countermeasure according to the embodiment of the invention is taken.
Figure 4B:
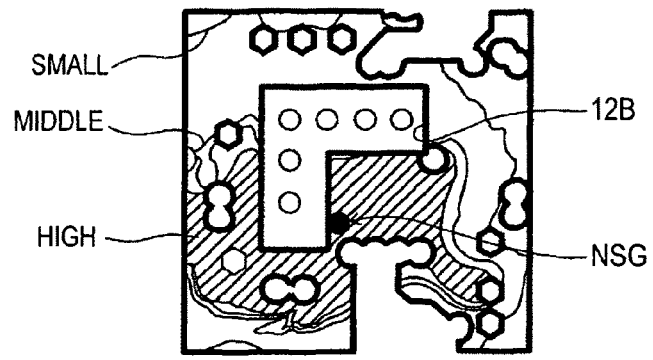
Figure 4C:
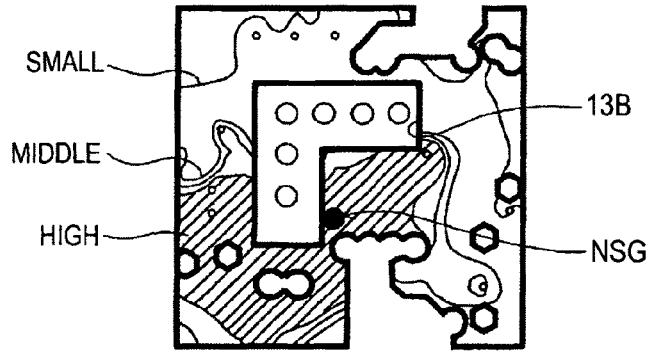
Figure 4D:
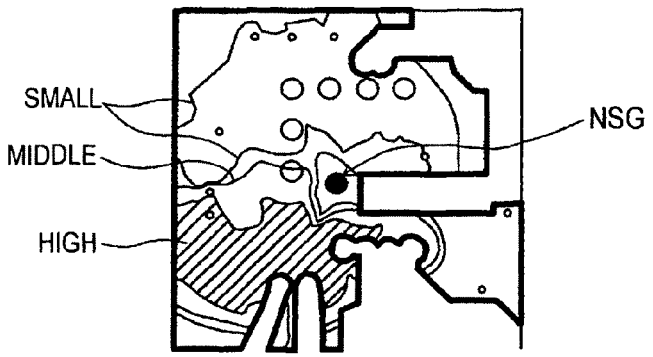

Here, the drawing is explained by using the L1 surface (wiring layer 16) of FIG. 4A. A thick solid line indicates a wiring layer contour. Besides, a portion which is almost close to the center of the L1 surface and in which 4×4 small circular marks are arranged corresponds to the rear surface BMP of the semiconductor chip, and the semiconductor chip 30 is arranged mainly in this portion.

An inverted L-shaped portion corresponding to the upper side and the left side of the semiconductor chip 30 corresponds to the opening 16B below the arrangement region of the inductor L. In the L2 surface (wiring layer 12A) of FIG. 4B, the opening 12B is provided at a similar position. Also in the L3 surface (wiring layer 13A) of FIG. 4C, the opening 13B is provided at a similar position. On the other hand, an opening is not formed in the L4 surface (rear surface ground plane 14).

The noise source NSG (for example, PLL) exists in the vicinity of the left corner of the semiconductor chip 30.

In the electromagnetic field simulation results, a high electric field region (oblique line part) of 500 A/m or higher, a middle electric field region lower limit, and a low electric field region lower limit are indicated.

When attention is paid to the high electric field region of the oblique lines, in the L1 surface closest to the noise source, the high electric field region is concentrated in a relatively narrow region. However, in the L2 surface and the L3 surface, the high electric field region propagates and expands to a very wide region. This extends to a portion just below the arrangement region of the inductor L. Although this can not be simulated since there is no conduction layer, this can be easily inferred from the state of the surrounding diffusion. Besides, an input/output circuit is also included in the high electric field region.

In the L4 surface of the lowermost layer, the high electric field region tends to reduce.

FIGS. 5A to 5D show electromagnetic field simulation results after the noise guiding through vias GH are suitably arranged to take a countermeasure.

Figure 5A:
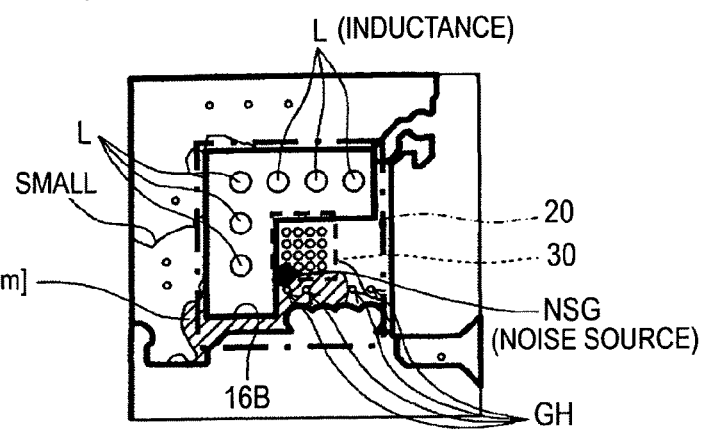
FIGS. 5A to 5D are views showing electric field intensity distributions obtained by electromagnetic field simulation, which are overlapped with the ground layer patterns of the L1 surface to the L4 surface and are obtained after noise guiding through vias of the embodiment of the invention are arranged.
Figure 5B:
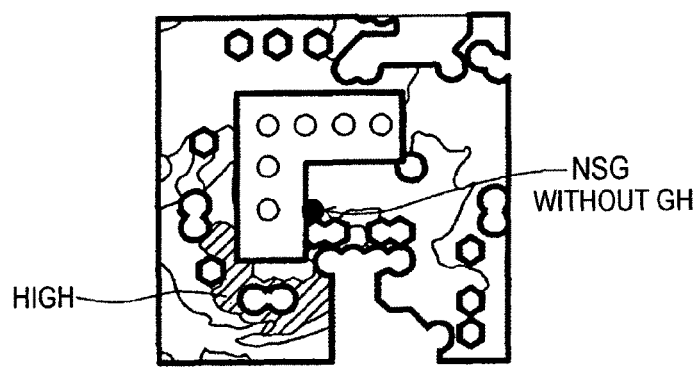
Figure 5C:
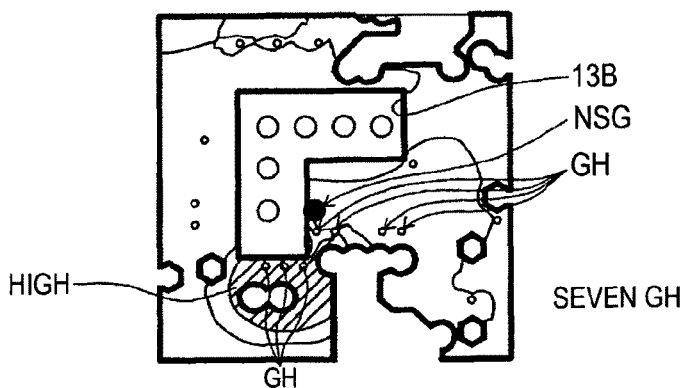
Figure 5D:
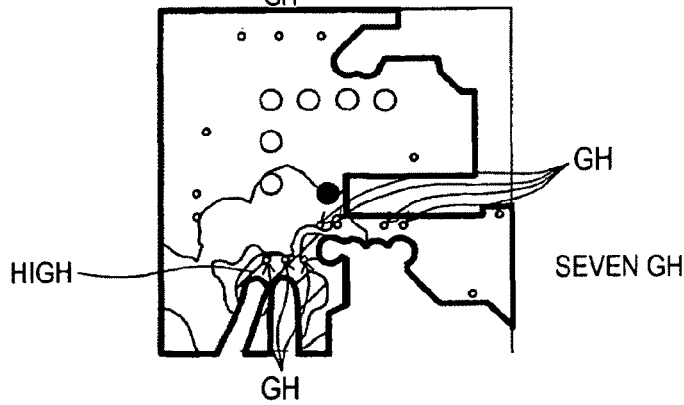

The pattern of FIG. 5A is different from that of FIG. 4A in that there are four noise guiding through vias GH which are arranged to be close to the noise NSG and to be gradually spaced from the noise source NSG along a chip side different from a chip side on the side where the inductor L is arranged, although they are small and are hard to see.

Besides, since the electromagnetic field tends to be guided dependently on the conductive layer pattern, three laterally arranged noise guiding through vias GH are formed on the opposite side of the opening across a narrow part of the conductive layer in the vicinity of the right end corner of the inverted L shape (the L3 surface and the L4 surface). Incidentally, in FIGS. 4A and 4B and FIGS. 5A and 5B, circular, hexagonal and gourd-shaped holes each having a diameter 10 or more times larger than the noise guiding through via GH are the through holes of the through vias.

The noise guiding through via GH is not connected to the neighboring wiring because the L2 surface is the power supply line. However, the electromagnetic field is guided to the lower layer through the through hole.

When FIGS. 5A to 5D are compared with FIGS. 4A to 4D, the high electric field region is greatly reduced. This is because the electromagnetic field passes through the noise guiding through vias GH and is quickly dispersed and transferred to the lower layer, and by this, the total electromagnetic field absorption power of the four ground layers is sufficiently exhibited.

Besides, it is understood that the distribution center of the high electric field region is moved in the direction of separating from the inductor L. By this, it can be said that the noise guiding through vias GH quickly guide the electromagnetic field noise to the lower layer, and also move the distribution center in the direction of separating from the inductor L.

With respect to the suitable arrangement of the noise guiding through vias GH, the above views are summarized as follows.

(1) It is desirable that the noise guiding through vias are unevenly provided on the side, in the surrounding direction of the noise source, different from the side of the circuit element which is desired to be protected against the influence of the electromagnetic noise.

(2) More desirably, the noise guiding through vias are provided in a specified range including a direction of separating from the circuit element with respect to the noise source. When there are plural noise guiding through vias, the specified range is determined from the necessity of the arrangement according to the number of and the interval between the noise guiding through vias. Besides, it is not necessary that the specified range is determined while a symmetric axis is provided in the direction of separating from the circuit element with respect to the noise source. There is a case in which a place where the noise guiding through via can be formed is limited by the restriction of the pattern of the ground layer. For example, even in such a case, it is sufficient if the formation place of the noise guiding through via is not the side of the circuit element with respect to the noise source, and it is more preferable that the formation place includes the side located away from the circuit element.

Further, in addition to the above (1) and (2), it is preferable that the noise guiding through vias GH are arranged to satisfy one of following factors (3) and (4).

(3) Even when the diameter of the noise guiding through via is approximately one digit smaller than the through hole of the through via for connecting the circuit wirings of different layers, it has a sufficient electromagnetic field guiding effect. Thus, the noise guiding through via may be smaller than the through hole of the through via. However, the noise guiding through via may has substantially the same size as the through via or the through hole thereof.

(4) The noise guiding through via is provided, with respect to the noise source, on the opposite side to the arrangement center of the circuit element closest to the noise source. Alternatively, it is preferable to provide the noise guiding through via on the side located away from the circuit element. Also in this case, similarly to the above, it is preferable that plural noise guiding through vias are arranged in the specified range while the distance between them is ensured.

Incidentally, in addition to any one of the above (1) to (4) or an arbitrary combination of them, it is desirable that at least one ground layer of the second circuit board 20 is electrically connected to at least one ground layer of the first circuit board 10 in which the noise guiding through vias are provided. The electromagnetic noise is guided to the lower layer side also through the electrical connection path between the ground layers. Thus, a more quick noise eliminating effect is obtained.

According to the embodiment, the following effects can be obtained.

When the SiP having plural built-in inductors is formed using the tuner IC and the wiring layers of the interposer, the ground layer is not formed in the interposer, but is formed on mother board side. At that time, in order to ensure the distance from the inductor, the ground layer is formed only in the lowermost layer so as to face the lower surface of the inductor. By this, it is possible to effectively prevent the L value and the Q value of the inductor from decreasing.

With respect to the layout of the ground layer on the mother board side, the noise guiding through vias GH are provided just below the noise generation source and in the vicinity thereof, and the current path to guide the distribution of the high magnetic field to the lowest possible layer is provided to prevent the propagation through the same layer and between layers from occurring. Besides, the noise guiding through vias GH are provided so that the center of the electromagnetic field distribution is located away from the inductor and the input/output circuit.

When the noise propagation path is located away from the inductor and the input/output circuit, the noise characteristic of the high frequency circuit typified by the spurious performance is greatly improved.

<5. Example of Product Application>

The above structure can be applied to, for example, a television display device (hereinafter abbreviated to a television) shown in FIG. 6, and other electronic equipments, especially, an electronic equipment including a tuner. Hereinafter, a typical example of an electronic equipment to which the embodiment is applied will be described.

Figure 6:
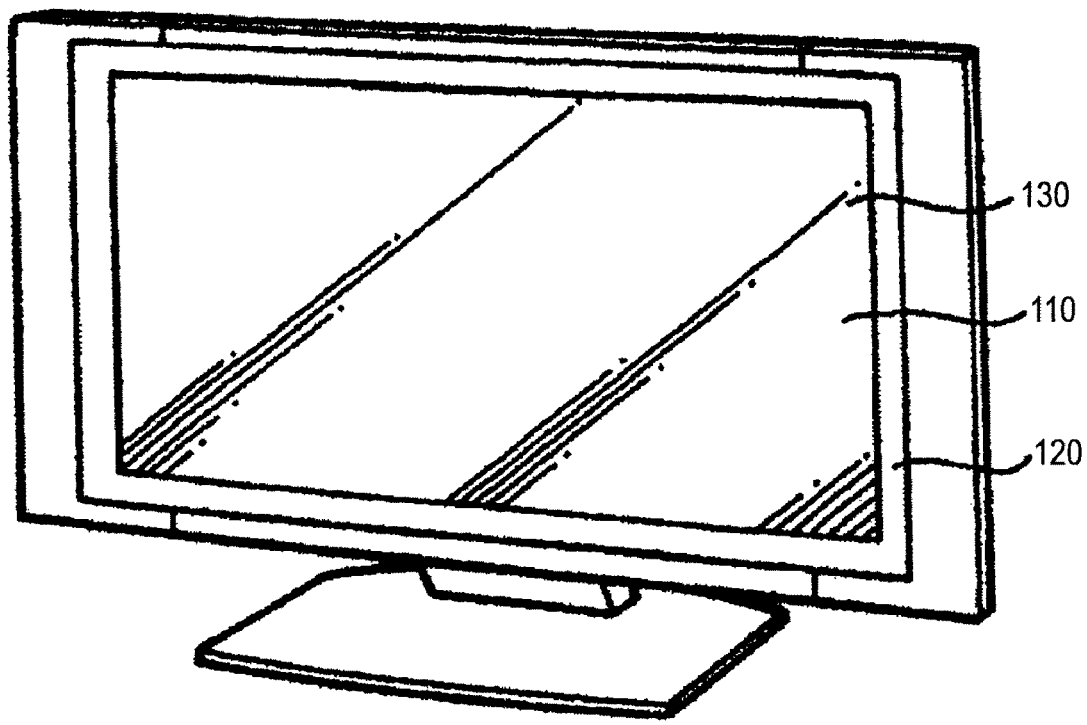
FIG. 6 is a perspective view showing a television to which the embodiment of the invention is applied.

FIG. 6 is a perspective view showing a television to which the invention is applied. The television of the application example includes an image display screen section 110 including a front panel 120, a filter glass 130 and the like. The invention can be applied to a not-shown printed wiring board in a housing or a module plate mounted thereon.

The present application contains subject matter related to that disclosed in Japanese Priority Patent Application JP 2009-296130 filed in the Japan Patent Office on Dec. 25, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A circuit board laminated module, comprising:
a first circuit board having a multi-layer structure in which ground layers are provided in a plurality of layers;
a second circuit board mounted on the first circuit board; and
a semiconductor chip mounted on the second circuit board, wherein
in the first circuit board, a noise guiding through via which guides an electromagnetic noise generated in the semiconductor chip to a lower layer side is provided on a side different from a circuit portion or a circuit element desired to be protected against influence of the electromagnetic noise in a surrounding direction of an occurrence place of the electromagnetic noise,
a plurality of layers of the second circuit board include at least one ground layer electrically connected to the ground layer of the first circuit board provided with the noise guiding through via,
the circuit element includes a laminate inductor formed using the wiring layer of the second circuit board, and
in a region below the laminate inductor, openings larger than an area of the laminate inductor are formed in all ground layers of ground layers of the second circuit board and the ground layers of the first circuit board except for a rear surface ground layer of a lowermost layer of the first circuit board.

2. A circuit board laminated module, comprising:
a first circuit board having a multi-layer structure in which ground layers are provided in a plurality of layers,
a second circuit board mounted on the first circuit board; and
a semiconductor chip mounted on the second circuit board, wherein
in the first circuit board, a noise guiding through via which guides an electromagnetic noise generated in the semiconductor chip to a lower layer side is provided on a side different from a circuit portion or a circuit element desired to be protected against influence of the electromagnetic noise in a surrounding direction of an occurrence place of the electromagnetic noise,
the circuit element includes a laminate inductor formed using a wiring layer of the second circuit board, and
in a region below the laminate inductor, openings larger than an area of the laminate inductor are formed in all ground layers of ground layers of the second circuit board and the ground layers of the first circuit board except for a rear surface ground layer of a lowermost layer of the first circuit board.

3. The circuit board laminated module according to claim 2, wherein a diameter of the noise guiding through via is equal to or smaller than a diameter of a through hole of a through via to connect circuit wirings of different layers.

4. The circuit board laminated module according to claim 3, further comprising a plurality of circuit elements which are external elements of the semiconductor chip, are arranged on the second circuit board, and are formed using a substrate wiring layer, wherein
the noise guiding through via is provided, with respect to the occurrence place of the electromagnetic noise, on a side opposite to an arrangement center where a specific circuit element of the plurality of circuit elements, to which the electromagnetic noise is applied when the noise guiding through via does not exist, is arranged.

5. The circuit board laminated module according to claim 4, wherein the plurality of noise guiding through vias are provided on the side opposite to the arrangement center where the specific circuit element is arranged, and are spaced from each other.

6. The circuit board laminated module according to claim 3, further comprising a plurality of circuit elements which are external elements of the semiconductor chip, are arranged on the second circuit board, and are formed using a substrate wiring layer, wherein
the noise guiding through via is provided, with respect to the occurrence place of the electromagnetic noise, on a side opposite to an arrangement center of the circuit element closest to the occurrence place.

7. The circuit board laminated module according to claim 6, wherein the plurality of noise guiding through vias are spaced from each other and are provided, with respect to the occurrence place of the electromagnetic noise, on a side which is an arrangement center and is opposite to an arrangement center where the one circuit element of the plurality of circuit elements closest to the occurrence place of the electromagnetic noise is arranged.

8. The circuit board laminated module according to claim 7, wherein a plurality of layers of the second circuit board include at least one ground layer electrically connected to the ground layer of the first circuit board provided with the noise guiding through via.

* * * * *